United States Patent
Posseme et al.

(10) Patent No.: US 12,369,340 B2
(45) Date of Patent: Jul. 22, 2025

(54) METHOD OF ENGRAVING A THREE-DIMENSIONAL DIELECTRIC LAYER

(71) Applicant: COMMISSARIAT A L'ENERGIE ATOMIQUE ET AUX ENERGIES ALTERNATIVES, Paris (FR)

(72) Inventors: Nicolas Posseme, Grenoble (FR); Valentin Bacquie, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 441 days.

(21) Appl. No.: 17/652,315

(22) Filed: Feb. 24, 2022

(65) Prior Publication Data

US 2022/0271149 A1    Aug. 25, 2022

(30) Foreign Application Priority Data

Feb. 25, 2021 (FR) ..................... 21 01866

(51) Int. Cl.
*H01L 21/02*     (2006.01)
*H01L 21/311*    (2006.01)
(Continued)

(52) U.S. Cl.
CPC ....... *H10D 30/024* (2025.01); *H01L 21/0223* (2013.01); *H01L 21/31116* (2013.01);
(Continued)

(58) Field of Classification Search
None
See application file for complete search history.

(56) References Cited

U.S. PATENT DOCUMENTS

| | | |
|---|---|---|
| 9,543,409 B2 | 1/2017 | Arvet et al. |
| 9,698,250 B2 | 7/2017 | Posseme et al. |
| | (Continued) | |

FOREIGN PATENT DOCUMENTS

| | | |
|---|---|---|
| EP | 3 107 125 A1 | 12/2016 |
| EP | 3 506 336 B1 | 11/2020 |

OTHER PUBLICATIONS

French Preliminary Search Report issued Nov. 15, 2021 in French Application 21 01866 filed on Feb. 25, 2021, 10 pages (with English Translation of Categories of Cited Documents & Written Opinion).

*Primary Examiner* — Bradley Smith
(74) *Attorney, Agent, or Firm* — Oblon, McClelland, Maier & Neustadt, L.L.P.

(57) ABSTRACT

A method is provided for etching a dielectric layer covering a top and a flank of a three-dimensional structure, the method including: a first etching of the dielectric layer, including: a first fluorine-based compound and oxygen, the first etching being performed to: form a first protective layer on the top and form a second protective layer on the dielectric layer, a second etching configured to remove the second protective layer while retaining a portion of the first protective layer, the first and the second etchings being repeated until removing the dielectric layer located on the flank of the structure, and before deposition of the dielectric layer, a formation of an intermediate protective layer between the top and the dielectric layer.

20 Claims, 7 Drawing Sheets

(51) Int. Cl.
  *H10D 30/01* (2025.01)
  *H10D 30/67* (2025.01)
  *H10D 64/01* (2025.01)

(52) U.S. Cl.
  CPC ....... *H10D 30/6743* (2025.01); *H10D 64/015* (2025.01); *H10D 64/025* (2025.01)

(56) References Cited

U.S. PATENT DOCUMENTS

| | | |
|---|---|---|
| 10,573,529 B2 | 2/2020 | Posseme et al. |
| 11,127,835 B2 | 9/2021 | Posseme et al. |
| 2016/0372568 A1 | 12/2016 | Posseme |
| 2019/0214266 A1* | 7/2019 | Posseme ........... H01L 21/31116 |
| 2020/0251570 A1* | 8/2020 | Posseme ............. H01L 29/0649 |

* cited by examiner

METHOD OF ENGRAVING A THREE-DIMENSIONAL DIELECTRIC LAYER

TECHNICAL FIELD

The present invention generally relates to the etching of layers on microelectronic, in particular three-dimensional (3D), structures.

It finds a particularly advantageous application in the production of FinFET type transistors, that is to say field effect transistors (FET) whose conduction channel comprises a vertical fin of a semiconductor material.

STATE OF THE ART

In order to improve the electrical performance of transistors, three-dimensional (3D) architectures have been developed. This is for example the case of transistor architectures based on nanowires and FinFET architectures.

An important issue of the methods for manufacturing transistors having a 3D architecture is mastering the etching of the spacers of these transistors.

By way of example, a FinFET type transistor 100 is illustrated in FIGS. 1 and 2, respectively before etching the spacers and after etching the spacers. In this 3D architecture, the conduction channel 110 consists of a vertical fin made of semiconductor material, typically silicon. The vertical fin forming the channel 110 is surrounded on three sides by the gate pattern 13. The vertical fin crosses right through the gate pattern 13 and is extended to form, on either side of the gate pattern 13, Fins 30. These Fins thus constitute three-dimensional (3D) structures.

In order to form the spacers 140 on the flanks of the gate pattern 13, a conformal deposition of a layer made of a dielectric material is first performed on the gate pattern 13 and the Fin 30 (FIG. 1).

As illustrated in FIG. 2, the etching of the dielectric layer 14 is ideally configured to remove the basal portions 14*b* and the Fin lateral portions 14*f* by retaining only the lateral gate portions 14*g* forming the spacers 140. Thus, all other layer portions 14, in particular those covering the Fin 30, whether they are perpendicular or parallel to the basal plane XY of the substrate 10, must be completely etched. This must be performed without leaving 190 residues and without damaging 160 the layers underlying the dielectric layer 14, typically without damaging the top 31 of the Fins 30 and/or without damaging the upper face of the BOX 12 (acronym for "burned oxide"). Moreover, it is important that the etching is anisotropic along z so as to avoid 170 the formation of feet at the base of the spacers 140.

The document EP 3506336 B1 provides for the formation of such spacers by repeating several sequences of oxidation and etching steps. This method aims at consuming the dielectric layer on the flanks of the Fin while protecting the top of the Fin.

In practice, however, the implementation of this etching method does not prove to be optimal. The top of Le Fin remains impacted. A material removal commonly called "recess" is typically observed at the top of the Fin to a depth of 1 to 2 nm. The etching depth accuracy and/or the etching stop thus remain perfectible.

There is therefore a need consisting in proposing a solution for etching, completely and with a great accuracy, a dielectric layer located on the faces of a 3D structure while avoiding damaging this 3D structure.

An object of the present invention is to overcome the limitations of the known solutions.

In the particular and non-limiting context of FinFET type transistors, an objective of the present invention consists in proposing a solution for etching, on the Fins, the dielectric layer intended to form spacers on the flanks of the gate, while avoiding, or even eliminating, the dielectric layer residues on either side of the Fins as well as the consumption of layers underlying the dielectric layer such as the semiconductor layer forming the Fin.

Another object of the present invention is to propose a method for manufacturing spacers allowing a better control of the etching stop at the top of three-dimensional structures such as Fins.

The other objects, features and advantages of the present invention will become apparent on examining the following description and the accompanying drawings. It is understood that other benefits may be incorporated.

SUMMARY

In order to achieve this objective, according to one embodiment, a method for etching a dielectric layer covering at least one top and one flank of a three-dimensional structure preferably based on a semiconductor material is provided. The method comprises depositing said dielectric layer on the top and the flank of the three-dimensional structure.

The method comprises a plurality of sequences each comprising at least the following successive steps:
  a first etching of the dielectric layer, by a first plasma based on a chemistry comprising:
    at least one first fluorine (F) based compound and
    preferably, at least one second compound taken from $SiwCl(2w+2)$ and $SiwF(2w+2)$, w being a non-zero integer,
    oxygen (O),
  said first etching being performed so as to:
    generate an ion bombardment directed mainly along a direction parallel to said flank,
    regulate the amount of the at least one first compound to consume all said first fluorine-based compound during this first etching so as to interrupt the first etching before consumption of the entire thickness of the dielectric layer located on the flank and after having consumed the entire thickness of the dielectric layer located at the top,
    form a first oxide-based protective layer at the top of the three-dimensional structure and form a second oxide-based protective layer on an upper portion of the dielectric layer located on the flank, the thickness $e50a$ of the first protective layer being greater than the thickness $e60a$ of the second protective layer,
  a second etching directed mainly along the direction parallel to said flank, and configured to completely remove the second protective layer while retaining a portion of thickness $e50b$ of the first protective layer above the top of the structure.

This sequence of first and second etchings is repeated until complete removal of the dielectric layer located on the flank of the structure.

Advantageously, the method being characterised in that it further comprises, before depositing the dielectric layer, a formation of an intermediate protective layer based on a protective material different from the dielectric material, the intermediate protective layer being formed so as to completely cover the three-dimensional structure and such that said intermediate protective layer is located between said top and the dielectric layer.

The dielectric layer does not directly cover the top of the three-dimensional structure, and preferably not directly the flank of the three-dimensional structure, unlike the method disclosed by the document EP 3506336 B1. The dielectric layer nevertheless indirectly covers the top of the three-dimensional structure, and preferably indirectly the flank of the three-dimensional structure, like the method disclosed by the document EP 3506336 B1. It therefore appears perfectly clear that the covering, as well as the terms "on" or "above", do not necessarily mean "in contact with".

The top of the three-dimensional structure is thus protected by the intermediate protective layer before the first etching of the dielectric layer.

In the context of the development of the present invention, it has indeed been observed that the first etching as disclosed by the document EP 3506336 B1 typically leads to an amorphisation of the semiconductor material at the top of the 3D structure. It appeared during the development of the present invention that this amorphisation of the top of the 3D structure occurred in particular before the initial formation of the first protective layer, or just at the beginning of this initial formation, when the first protective layer does not yet have a sufficient thickness to prevent an implantation of the energetic ions implemented during the first etching, in the material of the 3D structure.

In order to limit or eliminate the damage by amorphisation of the top of the 3D structure, an alternative solution to that proposed in the present invention was first considered in the context of the development of the present invention. This alternative solution consists in reducing the energy of the ions based on fluorinated or fluorocarbon species during the first etching. This alternative solution was not retained, because it has been observed, within the context of the development of the present invention, that this solution causes, during the first and/or second etchings, a degradation of the dimensional control of the spacers, also commonly called CD control or simply CD (acronym for "Critical Dimension").

The present invention is based on the contrary on a different principle, which consists in protecting the top of the 3D structure prior to the deposition of the dielectric layer. The top of the 3D structure is thus preserved from a subsequent recess. Moreover, the entire dielectric layer located on the flank of the 3D structure is etched in a controlled manner without fear of damaging the top of the 3D structure.

Indeed, the chemistry used during the first etching, combining fluorinated or fluorocarbon species and at least one silicon-based gas, allows efficiently etching the dielectric layer. The presence of oxygen in the plasma leads to the formation of a protective layer whose thickness is more significant on the protective material of the intermediate protective layer than on the dielectric layer.

The second etching allows removing the protective layer on the dielectric layer, while retaining a portion of this protective layer on the protective material. During the first etching of the following sequence, the top of the 3D structure will therefore be protected both by the residue of the first protective layer and by the intermediate protective layer. The top of the 3D structure will not be etched, while the exposed dielectric layer will be easily etched.

By repeating this sequence of steps, the dielectric layer is thus quickly etched while protecting the 3D structure.

Thus, the present invention proposes an effective solution for etching, completely and with a great accuracy, the dielectric layer on the top and the flanks of a 3D structure while avoiding damaging this 3D structure.

Advantageously, at least one additional effect is obtained thanks to the use of a protective material based on SiXO, with X a species taken from carbon (C) and nitrogen (N). The use of SiCO or SiON indeed allows promoting the formation of the first protective layer on the intermediate protective layer, during the first etching. The thickness of the first oxide-based protective layer formed on such an intermediate protective layer is thus greater than the thickness of a first oxide-based protective layer formed directly on the top of the 3D structure, all things being equal not elsewhere. This synergistic effect further improves the protection of the top of the 3D structure.

Unlike the known, even optimised, solutions the etching method according to the invention thus advantageously allows significantly improving the protection of the top of the 3D structure while allowing etching the dielectric layer effectively and in a safe manner on the flanks of the 3D structure.

When the 3D structure is intended to form a FinFET type transistor, the present invention thus proposes an effective solution for etching the dielectric layer deposited on the Fins, while avoiding, or even eliminating, a recess of the layers underlying the dielectric layer, in particular at the top of the Fins.

Another aspect of the present invention relates to a method for producing a FinFET transistor surmounting a support substrate, the FinFET transistor comprising a gate pattern and at least one channel passing through the gate pattern and extending from an edge of the pattern gate to form at least one structure preferably made of a semiconductor material, said structure having a top and at least two flanks.

The method comprises:
the etching of the dielectric layer by implementing the method according to any one of the embodiments of the etching method according to the invention, so as to completely remove the dielectric layer located on the structure formed by the channel while retaining a dielectric layer portion on the flank of the gate pattern, so that said portion forms a spacer of the FinFET transistor.

BRIEF DESCRIPTION OF THE FIGURES

The aims, objects, as well as the features and advantages of the invention will emerge better from the detailed description of embodiments thereof which are illustrated by the following accompanying drawings in which.

Figure 1:
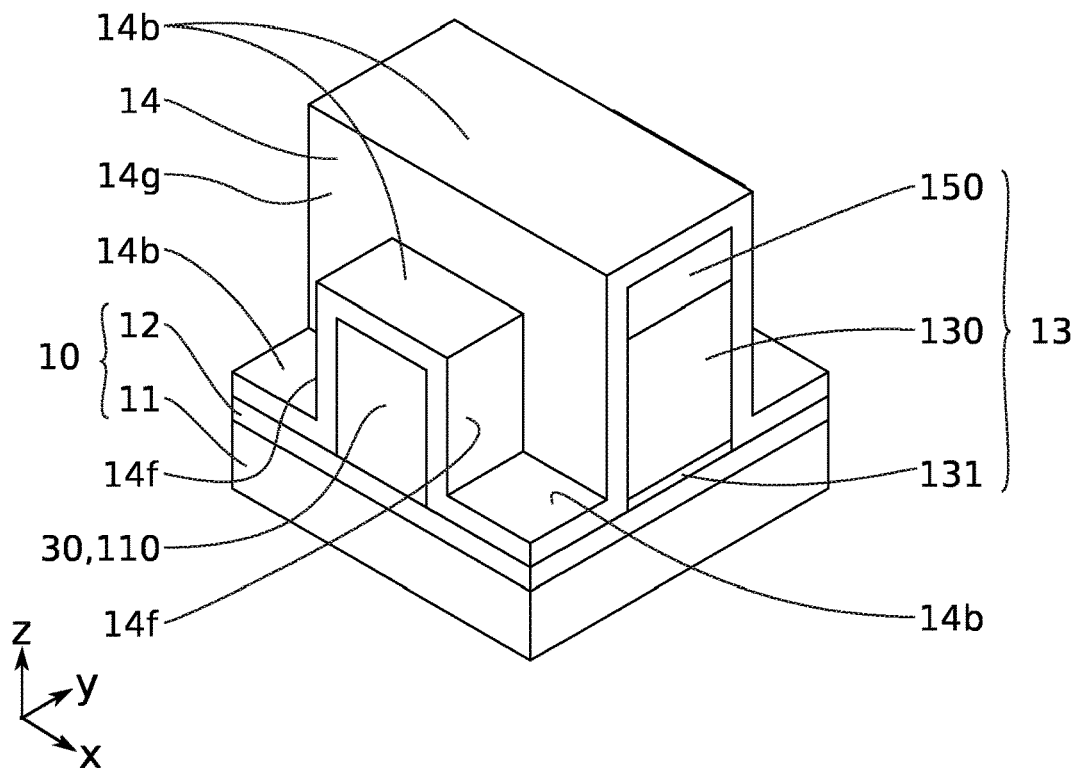
FIG. 1 schematically illustrates a FinFET type transistor in progress, before etching the spacers, according to the prior art.

The drawings are given by way of examples and are not limiting to the invention. They constitute schematic representations of principle intended to facilitate the understanding of the invention and are not necessarily on the scale of the practical applications. In particular, on the principle diagrams, the thicknesses of the different layers and portions, and the dimensions of the patterns are not representative of reality

DETAILED DESCRIPTION

Before starting a detailed review of embodiments of the invention, optional features are set out below which may possibly be used in combination or alternatively:

According to one example, the protective material is selected so as to have a resistance to etching by hydrofluoric acid (HF), such as an etch rate of said material by a HF-based solution is less than 5 nm/min. This allows avoiding a removal of the spacers by lift off during the implementation of the method in the context of the manufacture of the spacers of a FinFET transistor, during the removal by HF of the modified intermediate protective layer.

According to one example, the protective material is selected so as to have a dielectric constant k less than or equal to 4. This allows obtaining an intermediate protective layer compatible with the manufacture of spacers, in particular during the implementation of the method in the context of the manufacture of the spacers of a FinFET transistor.

The intermediate protective layer is formed so as to entirely cover the three-dimensional structure.

According to one example, the intermediate protective layer is formed directly in contact with the top of the three-dimensional structure.

According to one example, the second etching is performed by a second plasma based on at least one fluorocarbon species $C_xH_yF_z$, x, y and z being integers.

According to one example, the formation of the intermediate protective layer is configured so that the intermediate protective layer has a thickness $e20$ comprised between 2 nm and 5 nm.

According to one example, the first etching is configured so that the first formed oxide-based protective layer has a thickness $e50a$ greater than or equal to 5 nm.

According to one example, the second etching is configured so that the portion of the first retained protective layer has a thickness $e50b$ greater than or equal to 2 nm.

According to one example, the method comprises a preliminary step of oxidising the dielectric layer performed before said sequence of steps, the preliminary oxidation step being intended to limit a lateral etching of the dielectric layer during the first etching.

According to an exemplary embodiment, the method comprises a preliminary step of etching the dielectric layer, performed before said sequence of steps, the preliminary etching step being interrupted so as to retain a portion of the dielectric layer located on the intermediate protective layer, at the top of the structure. This step typically allows etching a large portion of the dielectric layer. It allows increasing the speed of the method.

According to one exemplary embodiment, the preliminary step of etching the dielectric layer is based on a fluorocarbon chemistry (for example $C_xF_y$ or $C_xH_yF_z$).

In the remainder of the description, it is considered that the fluorocarbon chemistries comprise in particular the fluorocarbon compounds ($C_xF_y$) and the hydrofluorocarbon compounds ($C_xH_yF_z$).

According to an exemplary embodiment, said first fluorine (F) based compound of the chemistry used for the first etching step originates, preferably integrally, from the chemistry used during said preliminary etching step.

Alternatively, at least one portion and optionally all the first fluorine (F) based compound of the chemistry used for the first etching step is provided during the first etching step.

According to an exemplary embodiment, the first fluorine (F) based compound originates from the dissociation of at least one compound taken from the fluorocarbon compounds (for example $C_xF_z$ or $C_xH_yF_z$).

According to one example, the first and second etchings are performed in the same reactor.

According to one example, the reactor is configured to form a capacitively coupled plasma.

According to an alternative example, the reactor is configured to form an inductively coupled plasma.

According to an exemplary embodiment, the structure is made of a semiconductor material and forms a channel of a FinFET transistor.

According to an exemplary embodiment, the gate pattern comprises a gate and a hard mask surmounting said gate.

According to one example, the hard mask thickness is greater than or equal to the height of the structure forming the channel of a FinFET transistor.

According to one example, the hard mask has a thickness $e150$, such that $e150 \geq e30$, $e30$ being at the height of the structure (30), and preferably $e150 \geq 1.2*e30$. Thus, when the etching entirely consumes the dielectric layer located on the flanks of the structure, the entire height of the flanks of the gate remains covered by the dielectric layer. Consequently, the removal of the dielectric layer on the flanks of the Fin does not lead to the removal of this dielectric layer on the flanks of the gate. The dielectric layer remaining on the flanks of the gate typically forms the spacers of the FinFET transistor.

According to an exemplary embodiment, the flank(s) of the 3D structure extend along a plane (YZ) perpendicular to a main plane (XY) along which the support substrate extends.

According to an exemplary embodiment, the top extends mainly in a plane parallel to the plane (XY) of the support substrate.

According to an exemplary embodiment, said 3D structure is formed by at least one block or fin of semiconductor material.

Preferably, the semiconductor material is silicon. The semiconductor material can alternatively be germanium (Ge) or silicon-germanium SiGe. The structure made of a semiconductor material can also be made of a succession of layers, each layer being for example taken from the following materials: silicon (Si), germanium (Ge), silicon-germanium (SiGe). Thus, for the production of nanowires, a succession of layers, each formed of Si or SiGe, may be provided.

According to one example, the dielectric material of the dielectric layer is taken from: SiN, Si3N4, SiC, SiCN, SiCBN.

According to an exemplary embodiment, when the dielectric layer located on the flank of the structure is completely etched, a step of removing the first protective layer is then performed.

Preferably, this removal of the first protective layer is performed using a hydrofluoric acid (HF) based solution.

According to one example, the method further comprises, after complete removal of the dielectric layer located on the flank of the three-dimensional structure, a step of oxidising the intermediate protective layer followed by a step of removing the oxidised intermediate protective layer.

According to one example, the protective material of the intermediate protective layer is SiCO, and the oxidation step is performed by an oxygen-based plasma such that the oxidised intermediate protective layer is based on SiO2.

According to one example, the step of removing the oxidised intermediate protective layer is made by a hydrofluoric acid (HF) based etching solution.

According to one example, the method is a method for forming the spacers of a transistor comprising a gate pattern and a three-dimensional structure adjacent to said gate pattern, the gate pattern and the three-dimensional structure being carried by an upper face of a substrate, said upper face extending along a basal plane xy, the gate pattern and the three-dimensional structure having respectively, along a direction z normal to the basal plane xy, a dimension in height hg and a dimension in height h30 such that hg>h30, the gate pattern further having first lateral flanks and said three-dimensional structure having a top and second lateral flanks, said method comprising:
- a formation of a dielectric layer made of a dielectric material covering the first lateral flanks of the gate pattern, the top and the second lateral flanks of the three-dimensional structure and at least partially the upper face of the substrate on either side of the pattern gate, said dielectric layer having first lateral portions covering the first lateral flanks, second lateral portions covering the second lateral flanks, at least one first basal portion covering the top of the three-dimensional structure and second basal portions covering the upper face of the substrate,
- a plurality of sequences each comprising at least the following successive steps:
- a first application of a first plasma configured to form a thick oxide film at the first and second basal portions and a thin oxide film on an upper portion of the first and second lateral portions,
- a second application of a second plasma configured to etch in the direction z:
  - the thick oxide film, only partially, and
  - the thin oxide film completely and at least one portion of the first and second lateral portions of the dielectric layer, said sequence being repeated until the complete removal of the second lateral portions covering the second lateral flanks of the three-dimensional structure, a remaining portion of the first lateral portions of the dielectric layer forming the spacers, said method further comprising, before the formation of the dielectric layer, a formation of an intermediate protective layer based on a protective material different from the dielectric material, at least on the top of the three-dimensional structure, so as to protect said top during etching along the direction z of the thick oxide film.

Except incompatibility, it is understood that all the above optional features can be combined so as to form an embodiment which is not necessarily illustrated or described. Such an embodiment is obviously not excluded from the invention.

It is specified that, within the scope of the present invention, the terms "over", "surmounts", "covers", "underlying", "opposite" and the equivalents thereof do not necessarily mean "in contact with". Thus, for example, the deposition of a first layer on a second layer does not necessarily mean that the two layers are directly in contact with each other, but means that the first layer at least partially covers the second layer by being either directly in contact therewith, or by being separated therefrom by at least one other layer or at least one other element.

A layer can moreover be composed of several sub-layers of the same material or of different materials.

The terms "a substrate", "a stack", "a layer", "based on" a material A mean a substrate, a stack, a layer comprising this material A only or this material A and possibly other materials, for example alloy elements and/or doping elements. Thus, a silicon-based layer means for example a Si, n-doped Si, p-doped Si, SiGe layer. A germanium-based layer means for example a Ge, n-doped Ge, p-doped Ge, SiGe layer.

The word "dielectric" describes a material whose electrical conductivity is low enough in the given application to be used as an insulator. In the present invention, a dielectric material preferably has a dielectric constant of less than 7.

The term "nature" of a material, means the chemical composition and/or the crystalline structure thereof. Thus two layers can be of the same chemical composition but of different nature from a crystallographic point of view.

Several embodiments of the invention implementing successive steps of the manufacturing method are described below. Unless explicitly mentioned, the adjective "successive" does not necessarily imply, even if this is generally preferred, that the steps follow each other immediately, intermediate steps being able to separate them.

Moreover, the term "step" means carrying out a part of the method, and may designate a set of sub-steps.

Moreover, the term "step" does not necessarily mean that the actions carried out during a step are simultaneous or immediately successive. Certain actions of a first step can in particular be followed by actions linked to a different step, and other actions of the first step can be repeated later. Thus, the term "step" does not necessarily mean unitary and inseparable actions in time and in the sequence of the phases of the method.

A preferably orthonormal reference frame, comprising the axes x, y, z is represented in the appended Figures. When only one reference frame is represented on the same sheet of figures, this reference frame applies to all Figures of this sheet.

In the present patent application, the thickness of a layer is taken along a direction normal to the main extension plane of the layer. Thus, a layer typically has a thickness along z. The relative terms "over", "surmounts", "under", "underlying" refer to positions taken in the direction z.

The terms "vertical", "vertically" refer to a direction along z. The terms "horizontal", "horizontally" refer to a direction in the xy plane. The term "lateral" refers to an xz plane. Thus, the lateral flanks of the gate extend parallel to an yz plane. The lateral flanks of the Fin structure extend parallel to an xz plane. Unless explicitly mentioned, the thickness, the height and the depth are measured according to z.

An element located "in line with" or "perpendicular to" another element means that these two elements are both located on the same line perpendicular to a plane in which a lower or upper face of a substrate mainly extends, that is to say on the same line oriented vertically in the figures.

Within the scope of the present invention, the term "three-dimensional structure" designates a structure forming a protrusion above a layer which is underlying it, such as a support substrate.

Figure 2:
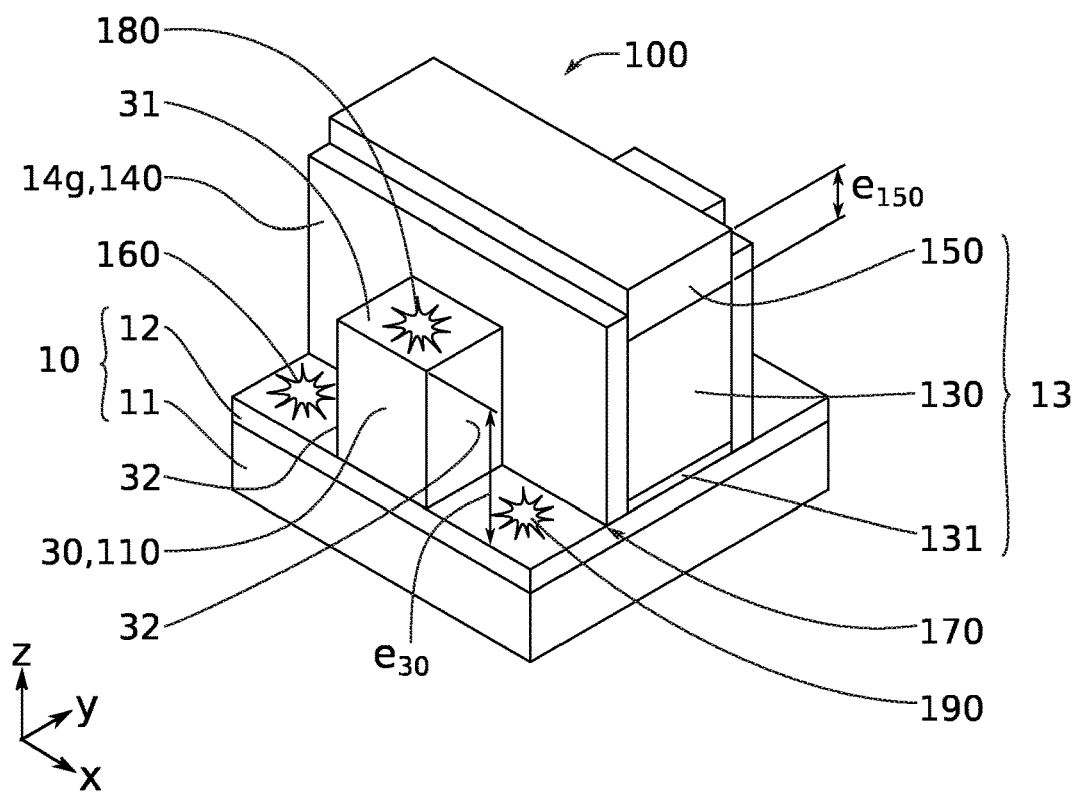
FIG. 2 schematically illustrates a FinFET type transistor in progress, after etching the spacers, according to the prior art.

Within the scope of the present invention, a non-limiting but particularly advantageous example of a 3D structure is a fin forming the extension of a FinFET transistor channel, as illustrated in FIG. 2. As mentioned above, the formation of the spacers flanking the gate pattern of this FinFET transistor requires an accurate etching of the portions of the dielectric layer covering the Fin.

FIGS. 3A to 3J illustrate an embodiment of the method for etching the dielectric layer 14 according to the invention. According to this non-limiting embodiment, an initial structure in the form of Fin 30 of a FinFET transistor is provided. For the sake of clarity, only the Fin 30 of the FinFET transistor is reproduced in FIGS. 3A to 3J, in transverse section along an xz plane. Only one flank 32 of the Fin 30 is represented. The same steps and features apply to the other flanks of the Fin 30 which are perpendicular to the basal xy plane. It is understood that this Fin 30 is preferably adjacent to a gate pattern 13 comprising in known manner a gate 130, a hard mask 150 and optionally a layer 131 with a high dielectric constant called "high k", as illustrated for example in FIG. 1.

All features, steps and technical advantages that will be described later also apply to embodiments in which the dielectric layer 14 surmounts a different three-dimensional structure of a Fin of a FinFET transistor. For example, they apply to structures forming nanowires and in particular stacked nanowires.

Figure 3A:
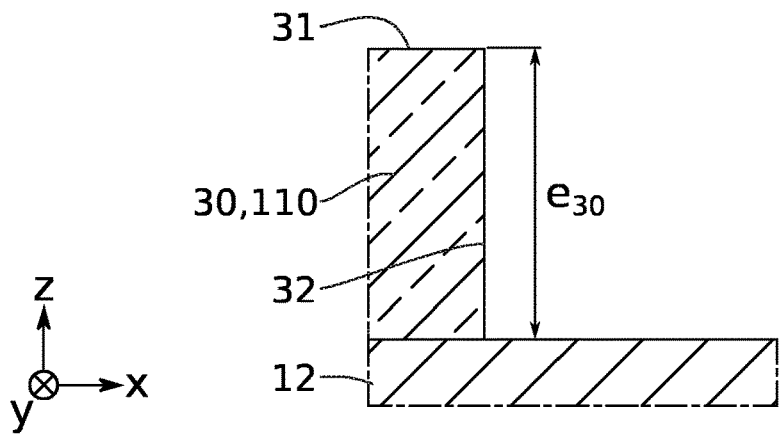
FIGS. 3A to 3J schematically illustrate steps of an etching method according to one embodiment of the present invention.

Fin 30 is herein supported by a substrate typically comprising an oxide-based upper portion 12 (FIG. 3A). The height e30 of the Fin 30 is referenced in FIG. 3A. For example, the height e30 of the Fin, measured in the direction Z from the upper face 120 of the upper portion 12 of the substrate, is comprised between a few nanometres and a few tens of nanometres. Preferably, e30 is comprised between 10 and 200 nanometres and even more preferably, e30 is comprised between 32 and 150 nm and even more preferably.

The upper portion 12 of the substrate can typically correspond to a buried oxide BOX layer originating from a substrate of the silicon-on-insulator SOI type. Other substrates, for example made of bulk semiconductor material, can alternatively be used. In particular, the upper portion 12 is not necessarily based on oxide.

Figure 3B:
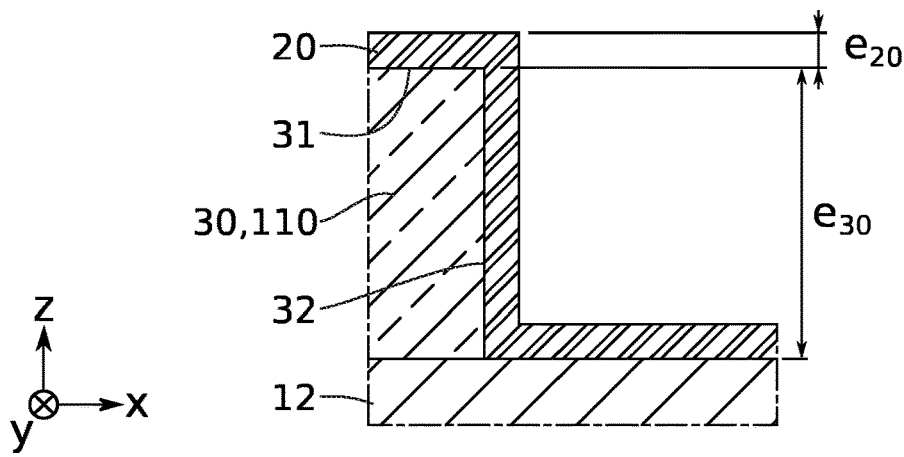

According to a principle of the present invention, an intermediate protective layer 20 is formed on the top 31 of the Fin 30, prior to the deposition of the dielectric layer to be etched, as illustrated in FIG. 3B. This intermediate protective layer 20 may typically be conformally deposited on the top 31 and flank 32 of the Fin 30, and at the surface 120 of the BOX 12. It may be formed by plasma enhanced chemical vapour deposition (PECVD), low pressure chemical vapour deposition (LPCVD), plasma enhanced atomic layer deposition (PEALD). It is preferably directly in contact with the top 31, the flank 32, and the surface 120.

The intermediate protective layer 20 is advantageously based on a material which is promoting a subsequent regrowth of oxide and resistant to HF. It is preferably based on SiCO, SiON or SiOCH. In particular, SiCO has several advantages in the context of the etching of the dielectric layer by the sequences of steps detailed below. This protective material is in particular resistant to the first etchings and resistant to HF. It can be transformed into $SiO_2$ or $SiO_x$ by exposure to an oxygen plasma, for example, to then be easily eliminated. It further promotes the growth of $SiO_x$ during the first etching.

The protective material of the intermediate protective layer 20 is further preferably compatible with the manufacture of spacers. It preferably has a low dielectric constant k, for example less than 4. SiCO typically has a dielectric constant k in this range (k≤4) and can perfectly act as a spacer or enter into the composition of a spacer.

The intermediate protective layer 20 typically has a substantially constant thickness e20, for example comprised between 2 nm and 5 nm, typically in the range of 3 nm.

Figure 3C:
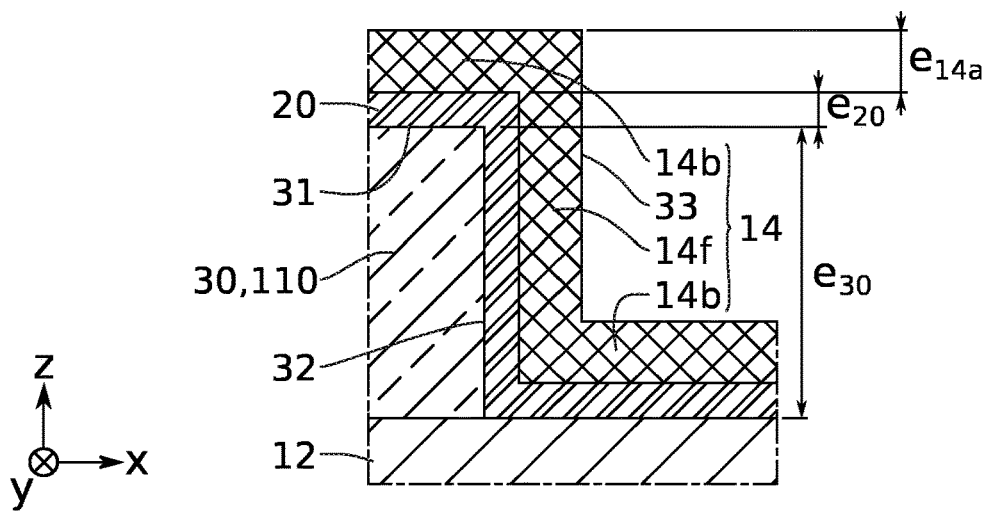

As illustrated in FIG. 3C, the intermediate protective layer 20 is then covered by a dielectric layer 14 comprising basal portions 14b and one or more lateral portions 14f.

Preferably, this dielectric layer 14 is a conformal layer.

In this example related to the FinFET transistors, this dielectric layer 14 is intended to form spacers on the flanks of the gate 130. This dielectric layer 14 is then formed in materials having a low dielectric constant. This dielectric layer 14 may or may not be porous. It is for example formed in one of the following materials: SiC, SiCN, SiCBN, or a silicon nitride ($SixNy$, x and y being integers), typically SiN.

Once deposited, this dielectric layer 14 has for example a thickness e14a comprised between 4 and 50 nanometres, preferably between 4 and 30 nanometres and preferably between 8 and 12 nanometres. The thickness e14a is measured along the direction Z. It is referenced in FIG. 3A.

This dielectric layer 14 is for example formed by one of the following techniques: plasma enhanced chemical vapour deposition (PECVD), low pressure chemical vapour deposition (LPCVD), plasma enhanced atomic layer deposition (PEALD).

Starting from the structure illustrated in FIG. 3C, several steps will be implemented in order to completely remove the dielectric layer 14, without leaving any dielectric layer residues and without damaging the Fin 30 and the upper portion 12 of the substrate.

Figure 3D:
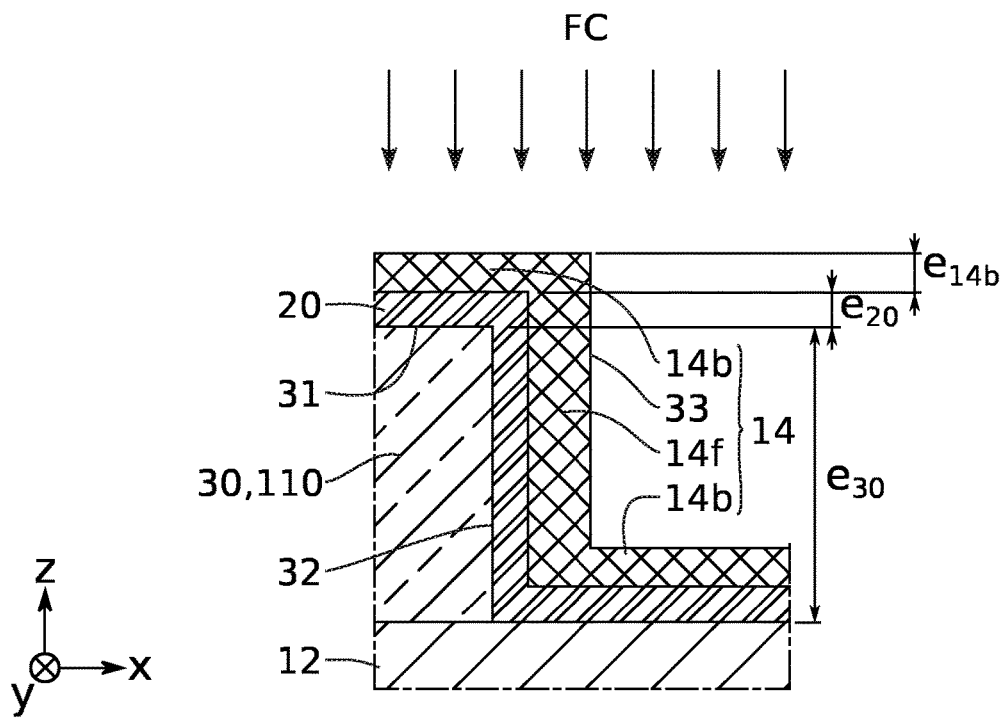

FIG. 3D illustrates an optional step during which only one portion of the thickness of the dielectric layer 14 is removed on the areas parallel to the XY plane of the substrate. This removal step mainly comprises an anisotropic etching directed along z. This anisotropic etching allows increasing the speed of the method before the subsequent steps which will allow a very accurate etching.

Typically, during this preliminary etching step, more than 70% and preferably more than 80% and even more preferably more than 90% of the initial thickness e14a of the dielectric layer 14 is etched.

Typically, at the end of the etching, the dielectric layer 14 has a residual thickness e14b greater than 2 nm, preferably greater than 3 nm and preferably greater than 4 nm. Typically, the residual thickness e14b is comprised between 2 and 3 nm, so as to limit the ion bombardment in the underlying intermediate protective layer 20, during this preliminary etching.

This etching step is for example carried out in an etching equipment of the inductively coupled plasma (ICP) reactor or capacitively coupled plasma (CCP) reactor type.

This plasma etching step is based on a chemistry including a fluorine (F) based compound. Preferably, this chemistry comprises a fluorocarbon species, for example taken from the following species $C_xH_yF_z$ or $C_xF_y$, x, y and z being integers. This etching chemistry has the advantage of improving the anisotropy of the etching. This anisotropy allows not to etch the surfaces which are parallel to the preferred direction of etching. In the case of a FinFET transistor, the anisotropy of the etching allows not to etch the portions 14g of dielectric layer 14 located on the flanks of the gate 130 and intended to form the spacers 140 of the transistor. The dimensional control, along y, of these spacers 140 directly impacting the performance of the transistor, it is important not to involuntarily etch the dielectric layer 14 on the flanks of the gate 130.

Preferably, the fluorocarbon chemistry also comprises at least one additional dilution or dissociation species such as argon (Ar), helium (He), nitrogen (N) or oxygen (O). The plasma can be continuous or pulsed.

According to an example, the conditions of this preliminary etching are as follows: the plasma is formed from CHF3 having a flow rate of 30 sccm, and from helium having a flow rate of 220 sccm. The power of the source is 300 W and the bias voltage (bias) is 65 V. The pressure is 5 milliTorr. The temperature of the support substrate is 60° C. The etching time is 20 s. This typically allows etching about 6 nm of SiN.

Figure 3E:
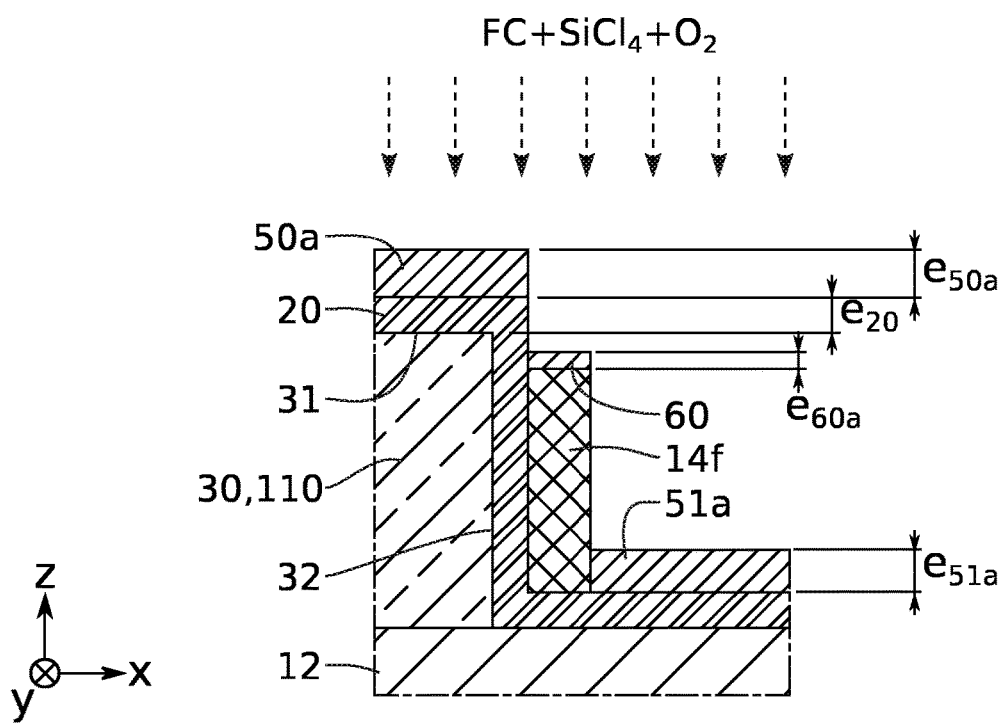
Figure 3F:
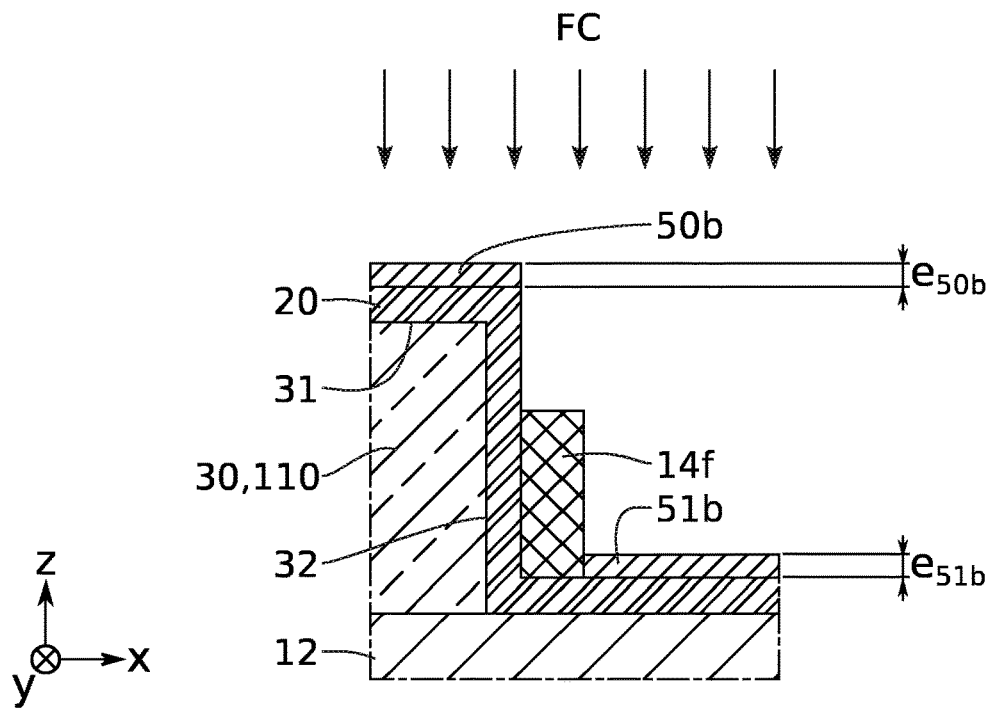
Figure 3G:
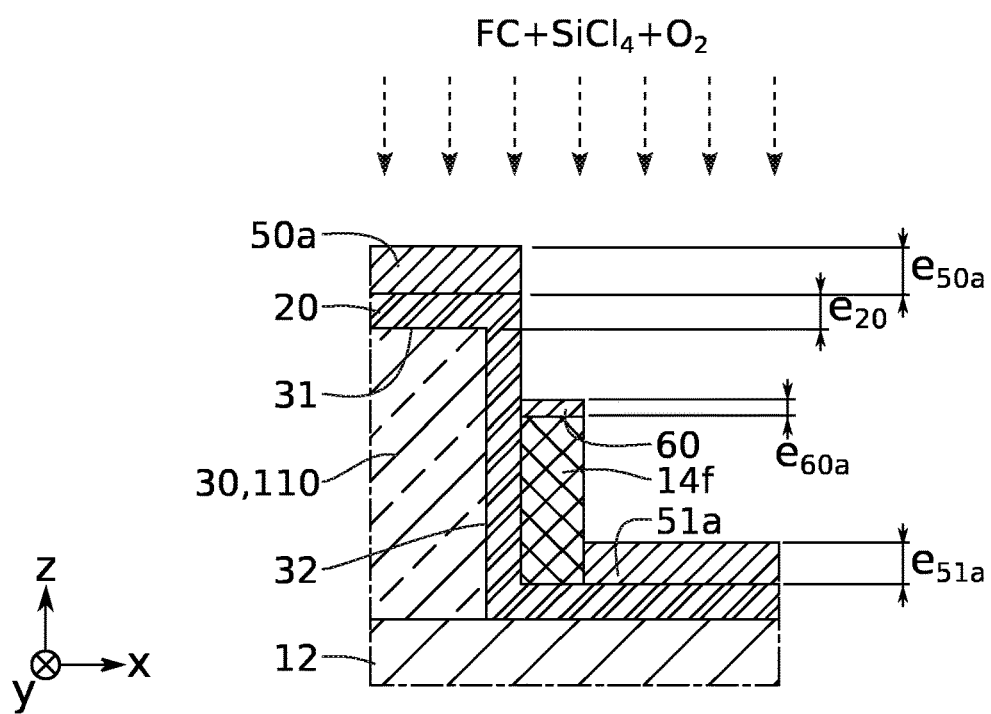
Figure 3H:
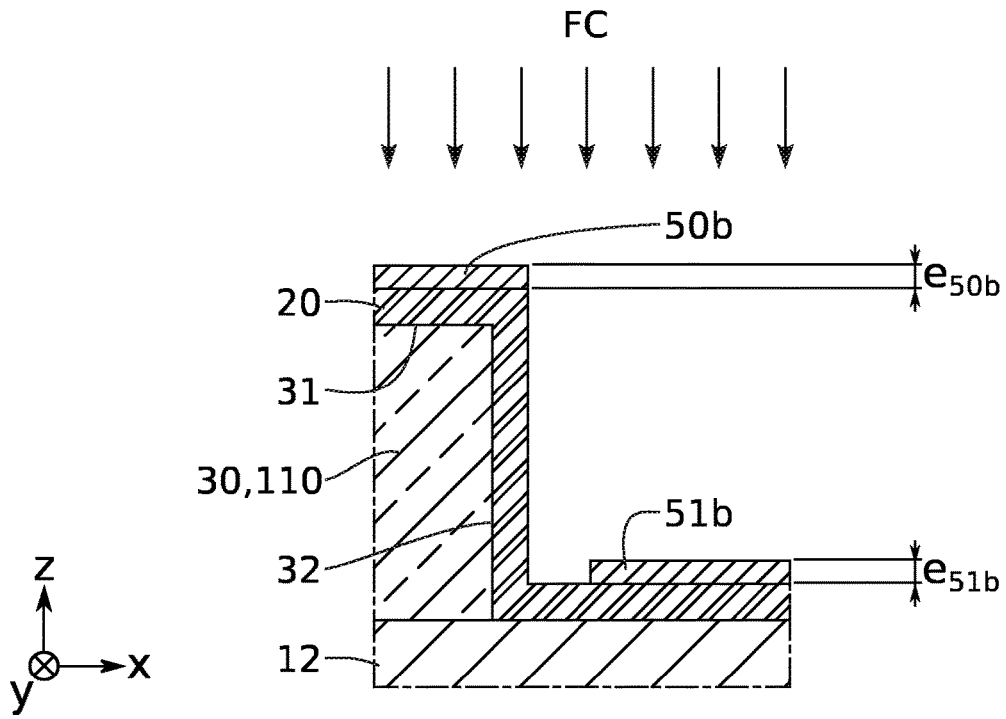
Figure 3I:
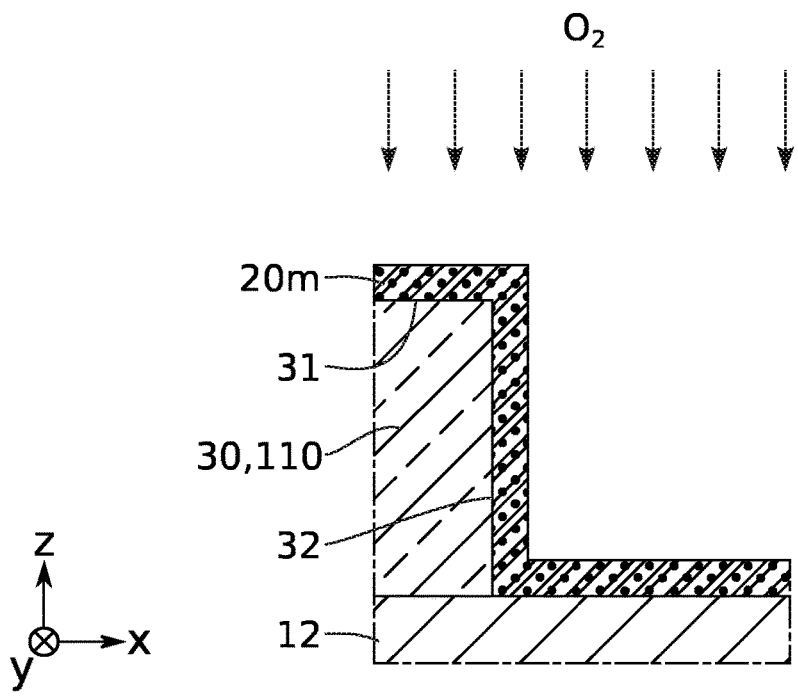

FIGS. 3E to 3G illustrate different steps of a sequence of steps which can be reiterated until obtaining the result which is illustrated in FIG. 3H.

As illustrated in FIG. 3E, at the end of the preliminary etching, or after the deposition of the dielectric layer 14 (in the case where there is no preliminary etching), a first etching of the dielectric layer 14 is performed.

This first etching is configured so as to etch the material of the dielectric layer 14 preferably to the protective material of the intermediate protective layer 20.

Moreover, this etching is configured so as to:
  be interrupted before consuming the entire height along z of the lateral portion 14f of the dielectric layer, located at the flank 32;
  form a first protective layer 50a above the structure 30 and form a second protective layer 60 on an upper portion of the lateral portion 14f of the dielectric layer, the thickness e50a of the first protective layer 50a being greater than the thickness e60a of the second protective layer 60.

This first etching is preferably a plasma etching. This first etching of the dielectric layer 14 uses a chemistry comprising:
  at least one first fluorine (F) based compound and
  at least one second compound taken from SiwCl(2w+2) and SiwF(2w+2) w, x, y and z being integers,
  oxygen (O).

The first fluorine-based compound allows an effective etching of the dielectric layer 14 with a good anisotropy.

The second compound allows improving the selectivity of the etching of the dielectric layer relative to the underlying intermediate protective layer, for example made of SiCO.

The amount of the first fluorine-based compound is regulated so as to consume all fluorine-based compounds, and therefore to interrupt the first etching before consuming the entire thickness (taken along the Z axis) of the lateral portion 14f of dielectric layer 14 which is located against the flank 32.

According to a particularly advantageous embodiment, the first fluorine-based compound has been fully introduced during the preliminary etching step illustrated in FIG. 3D. The fluorine remaining at the end of this preliminary etching step is used during said first etching until it is completely consumed.

Alternatively, some or all of the fluorine-based compounds consumed during this first etching are introduced into the plasma reactor during this first etching.

The presence of oxygen in the chemistry of the plasma allows forming an oxide on the surface of the exposed layers. As long as there are compounds allowing the etching of the layers, typically the fluorine-based compound, the etching does not allow the formation of an oxide layer. However, once the compounds allowing the etching have been completely consumed, one or more oxide layer(s) are formed on the exposed surfaces. These oxide layers grow or are deposited mainly along z, according to the preferred direction of bombardment of the ions originating from the plasma. The composition and/or the thickness of these oxide layers can vary depending on the nature of the surfaces on which they are formed. These oxide layers are typically based on SiOx.

Advantageously, the protective material promotes the formation of these oxide layers.

Thus, an oxide layer also called first protective layer 50a is formed on the exposed surface of the intermediate protective layer 20 protecting the top 31 of the structure 30. This first protective layer 50 is for example of the SixOyFz type, if the protective material is based on SiCO.

An oxide layer also called second protective layer 60 is formed on the upper portion of the lateral portion 14f of the dielectric layer located against the flank 32 of the Fin 30. This second protective layer 60 is for example of the SixOyNwFz type, if the dielectric layer 40 is based on SiN.

An oxide layer also called third protective layer 51a is formed on the exposed surface of the intermediate protective layer 20 protecting the upper face 120 of the substrate. This third protective layer 51a is for example of the SixOyFz type, if the protective material of the intermediate protective layer 20 is based on SiCO.

The formation of the first protective layer 50a is preferred due to the nature of the protective material, typically SiCO.

It follows that the thickness e50a of the protective layer 50a is greater than the thickness e60a of the protective layer 60 formed on the lateral portion 14f. Typically, e50a≥k1·e60a, with k1=1.5 and preferably k1=2 and preferably k1=3.

Advantageously, the protective layer 51a has a thickness e51a greater than the thickness e60a of the protective layer 60 located on the lateral portion 14f. Typically, e51a≥k2·e60a, with k2=1.5 and preferably k2=2 and preferably k2=3.

Preferably, the chemistry used for this first etching also comprises dilution or dissociation species such as argon, helium or nitrogen. The plasma can be continuous or pulsed. In general, a pulsed plasma allows limiting the damage to the underlying layers. The frequency of the pulsed plasma is preferably comprised between 200 Hz and 5 kHz, preferably in the range of 500 Hz, with an activation rate of 10% to 90% and typically 50%.

For example, during this first etching, a chemistry is used for the plasma comprising:
  CxHyFz, for example CH3F,
  SiCl4 whose flow rate is comprised between 2 and 15 sccm and preferably between 2 and 5 sccm,
  oxygen,
  possibly a dissociation gas such as Ar, He or N2.

According to an example, the conditions of the first etching are as follows: the plasma is formed from a mixture of CH3F having a flow rate of 200 sccm, helium having a flow rate of 120 sccm, SiCl4 having a flow rate of 5 sccm, and oxygen having a flow rate of 200 sccm. The power of the source is 400 W and the bias voltage (bias) is 250 V. The pressure is 90 milliTorr. The temperature of the support substrate is 60° C. The etching time is 30 s. This allows forming a first protective layer 4 to 5 nm thick on the exposed portions of the intermediate protective layer while having consumed 5 to 7 nm of SiN from the lateral portion of the dielectric layer.

Typically, beyond a duration of 30 to 35 seconds, the lateral portion 14f of the SiN dielectric layer is no longer etched and the second oxide protective layer 60 begins to be deposited on the SiN. It can be deduced therefrom that the species actively participating in the etching, such as the fluorine-based compound (F), are no longer present in sufficient quantity beyond this duration. At the end of this duration, it is therefore possible to interrupt the first etching, then implement the second etching.

The person skilled in the art will be able to determine operating conditions adapted for the materials and thicknesses of their application. Thus, he will be able to determine the SixCly or SixFy content in the mixture as well as the etching time.

As illustrated in FIG. 3F, after the first etching, a second etching is performed.

The first and second etchings, and optionally the preliminary etching, are preferably performed in the same etching equipment, for example of the inductively coupled plasma (ICP) reactor or inductively coupled plasma (ICP) reactor type. The first and second etchings can thus be carried out cyclically in situ in the same reactor.

The first etching can be extended at the beginning of the second etching, for a time called or "overetch (OE)" time according to current terminology.

The second etching aims to completely remove the second protective layer 60 located on the upper portion of the lateral portion 14*f* of the dielectric layer while retaining a portion 50*b* of thickness e50*b* of the first protective layer at the top 31 of the Fin 30.

This objective is all the more easily achieved when the thickness e50*a* of the first protective layer 50*a* is thicker than the thickness e60*a* of the second protective layer 60.

Moreover, during this step, a portion 51*b* of thickness e51*b* of the third protective layer formed above the insulating layer 12, is also retained.

The second etching is anisotropic, directed mainly along z. It is performed by plasma from a chemistry comprising a fluorine (F) based compound. Preferably, this chemistry comprises a fluorocarbon species, for example taken from the following species CxHyFz or CxFy, x, y and z being integers, such as CF4 for example. Thus, the same chemistry can be used as for the preliminary etching step, preferably with a lower bias voltage than during the preliminary etching, this in order to limit the consumption of the underlying layers.

It is also possible to use chemicals based on SxFy, such as SF6. Preferably, the fluorocarbon chemistry also includes at least one additional dilution or dissociation species such as argon (Ar), oxygen (O), helium (He) or nitrogen (N). Argon can have the drawback of making the etching rate too high. Typically, the thickness of the protective layer that is etched during this second etching step is less than 4 nm and preferably less than 2 nm.

According to one example, the conditions of this second etching are as follows: the plasma is formed from CF4 having a flow rate of 50 sccm. The power of the source is 1200 W. The pressure is 100 milliTorr. Under these conditions, the SiOx etching rate of the protective layers is in the range 4 nm/min.

This second etching step can be interrupted at the time, after the entire protective layer 60 has been consumed and preferably before the entire protective layer 50*b*, 51*b* has been consumed.

At the end of this second etching step, the sequence of steps comprising the first etching step and the second etching step is reiterated. The first and second etchings are thus repeated alternately.

Throughout each sequence, the top 31 of the Fin 30 remains protected both by the first protective layer 50*a*, 50*b* formed during the first etching step of each sequence, and by the underlying intermediate protective layer 20. It is the same for the upper face 120 of the insulating layer 12 which remains protected by the protective layer 60*a*, 60*b* and by the underlying intermediate protective layer 20. During each first etching, the lateral portion 14*f* of the dielectric layer 14 has for its part been heavily consumed.

As illustrated in FIG. 3G, at the end of the second etching, a new first etching is performed. It can be seen in this FIG. 3G that the height e30 of the Fin 30 has not been consumed and that the top 31 of the Fin 30 is still covered by the intermediate protective layer 20 and by a protective layer 50*a*. The lateral portion 14*f* of dielectric layer 14 at the flank 32 of the Fin 30 has meanwhile been significantly consumed.

FIG. 3H illustrates the result which is obtained when the SiN etching is stopped at the end of a first etching step or even a second etching step after reiterating the sequence of steps. As illustrated, the portion 14*f* of dielectric layer 14 against the flank 32 of the Fin 30 is completely consumed. However, the height e30 of the Fin 30 has not been consumed. The top 31 of the Fin 30 is still covered by the intermediate protective layer 20 and by an oxide protective layer 50*a*, 50*b*. The upper face 120 of the insulating layer 12 is always covered by the intermediate protective layer 20 and by an oxide protective layer 51*a*, 51*b* which is not necessarily continuous or uniform in thickness.

Additional sequences of first and second etchings can be performed so as to consume the entire height of lateral portion 14*f*.

It is then possible to remove the protective layers 50*b*, 51*b* based on SiOx or SiOCl. For this, a removal by oxygen plasma can advantageously be carried out, typically within the same reactor as that used for the first and second etchings. The oxygen allows possible both removing the residual protective layers 50*b*, 51*b*, and modifying the intermediate protective layer 20*m*. By being exposed to the O2 plasma, the SiCO protective material is transformed into SiOx. The modified intermediate protective layer 20*m* is then based on SiOx. Such a layer can then be easily, typically wet, removed for example using an HF (hydrofluoric acid) bath diluted to 1%. In general, the modified oxide-based protective intermediate layer 20*m* is not very dense and will be etched faster than the BOX-type oxide of the insulating layer. Thus, the consumption of the BOX-type oxide of the insulating layer remains very low, or even non-existent.

Figure 3J:
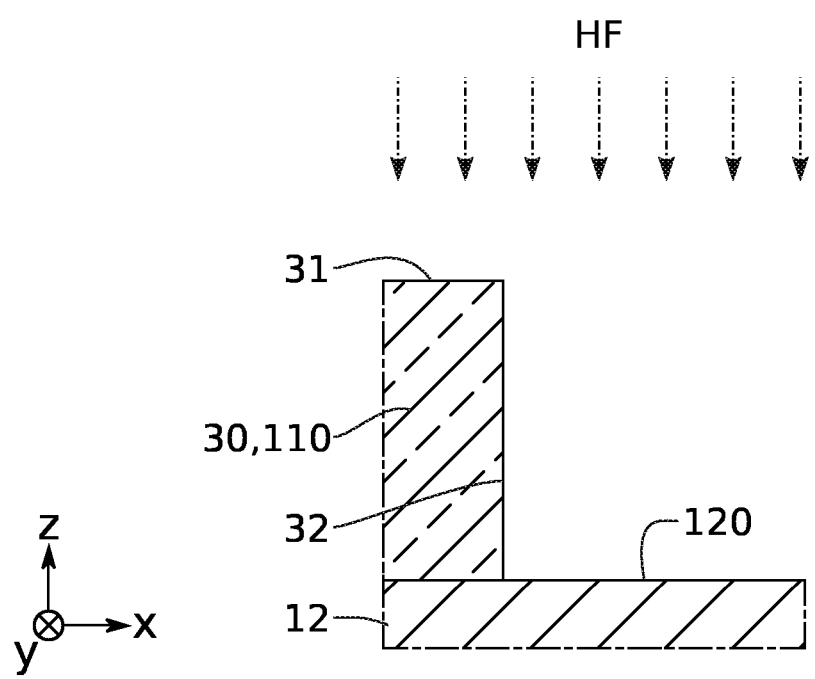

FIG. 3J illustrates the result obtained after removal of the modified intermediate protective layer 20*m*. The Fin 30 is fully exposed, without being damaged.

Optionally, before etching the dielectric layer 14, that is to say before the preliminary step if it is performed or before the first sequence comprising the first and second etchings, it is possible to perform a step of protecting the flanks 33 of the dielectric layer 14 (FIG. 3C). Indeed, during the different etchings, it is sought to etch the dielectric layer 14 along a direction Z perpendicular to the plane XY of the substrate 10. Thus, it may be advantageous to limit the lateral consumption (along the X axis) of the dielectric layer 14. For this, it is possible to form, preferably by oxidation, a lateral protective layer on the dielectric layer 14.

Figure 4:
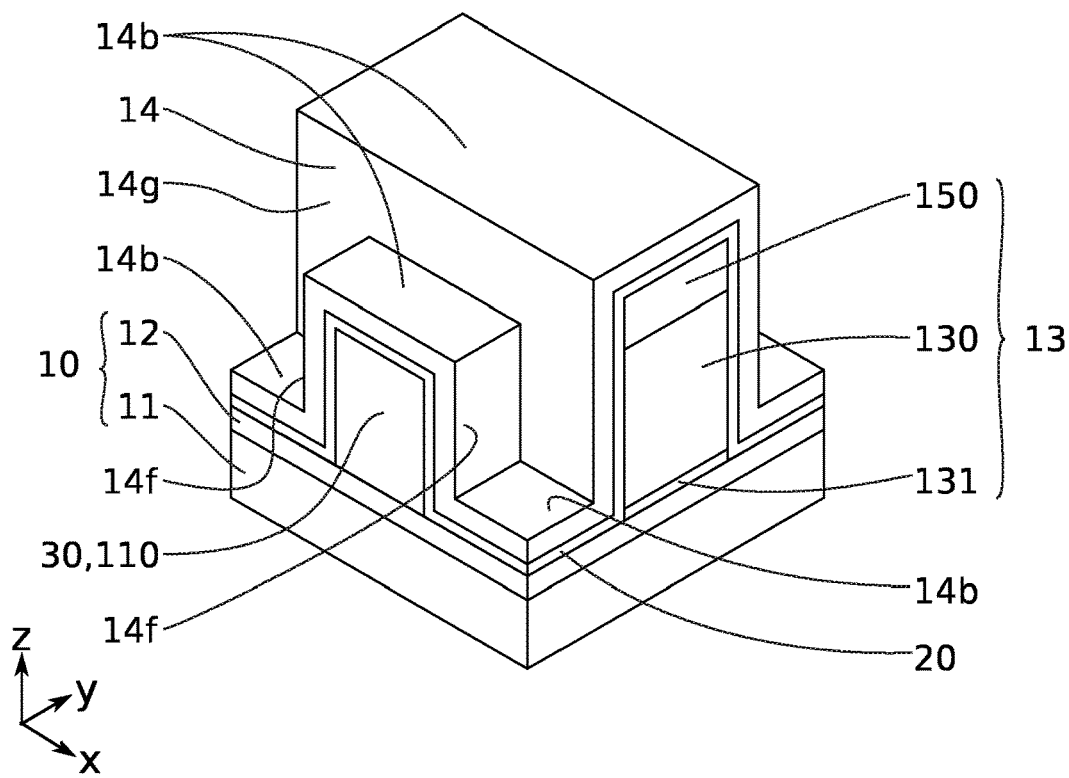
FIG. 4 schematically illustrates a FinFET type transistor in progress, before etching the spacers, according to one embodiment of the present invention.
Figure 5:
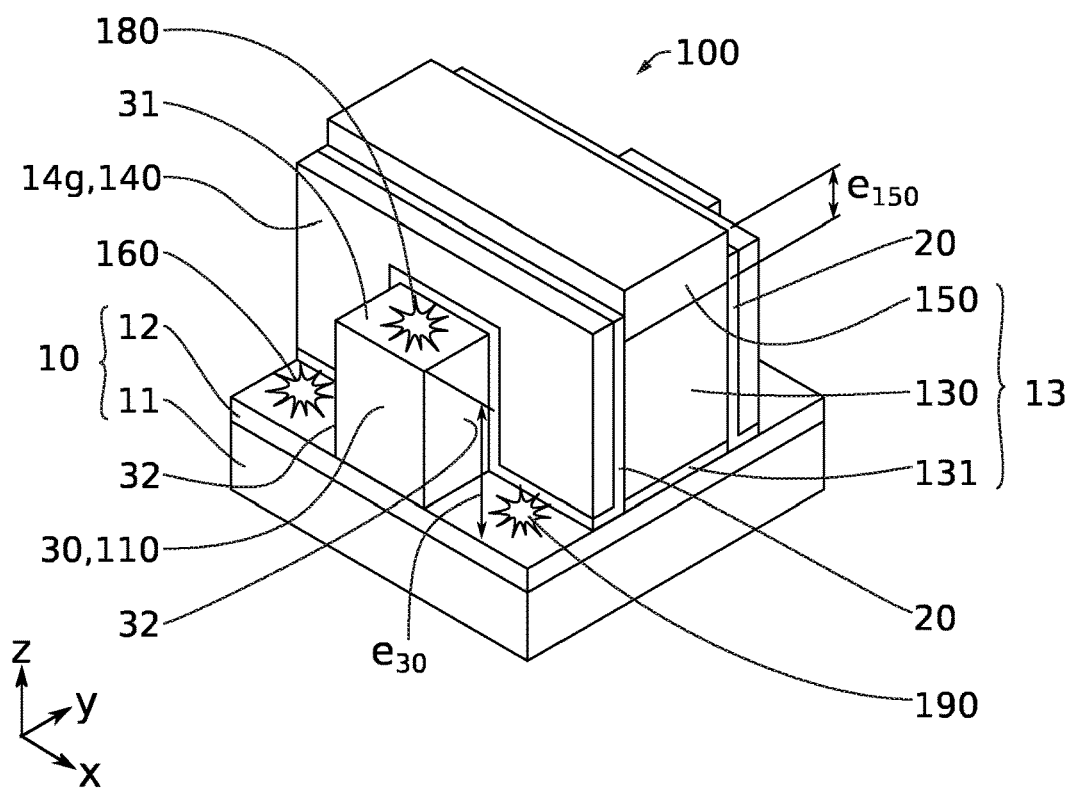
FIG. 5 schematically illustrates a FinFET type transistor in progress, after etching the spacers, according to one embodiment of the present invention.

In the case of the production of a FinFET transistor, it is desired to keep the portion 14*g* of dielectric layer 14 on the flanks of the gate 130 while fully exposing the Fins 30 (FIGS. 4, 5). This portion 14*g* is typically separated from the flanks of the gate 130 by the intermediate protective layer 20 (FIG. 4). Advantageously, by using a protective material based on SiCO, the modified intermediate protective layer 20*m* is eliminated at the end of the method by HF while a portion 20*g* of the unmodified intermediate protective layer 20 is kept on the flanks of the gate 130 (FIG. 5), due to the HF resistance of SiCO. This avoids a phenomenon of detachment or lift off of the portion 14*g* during removal by HF in a wet method.

The flanks of the gate 130 and the flanks 32 of the Fin 30 are generally both perpendicular to the main plane XY of the support substrate 10, and are generally parallel to the main direction Z of implantation of the ions resulting from the plasma. In order to avoid consuming the entire dielectric layer on the flanks of the gate 130 during the removal of this same layer on the flanks of the Fins 30, it is provided that the thickness e150 of the hard mask 150 surmounting the gate 130 is greater than or equal to the thickness e30 of the Fin 30. Thus, when the lateral portions 14*f* of dielectric layer 14 carried by the flanks 32 of the Fin 30 will be entirely consumed, the dielectric layer 14 will have been consumed over at least one portion of the thickness of the hard mask 150 but will continue to completely cover the flanks of the gate 130. The spacers 140 thus formed each typically comprise the portion 14*g* of dielectric layer and the portion 20*g* of the remaining intermediate protective layer 20 (FIG. 5). Advantageously, the protective material of the intermediate protective layer 20 is selected so as to have a dielectric constant k suitable for the manufacture of spacers, typically k≤4.

In view of the foregoing description, it clearly appears that the present invention proposes an effective solution for etching, completely and with a great accuracy, the dielectric layer on the top and the flanks of a 3D structure while avoiding damaging this 3D structure.

The invention is not limited to the previously described embodiments.

For example, the method may not comprise a preliminary etching step. Thus, the etching of the dielectric layer is only operated by the sequences comprising the first and second etchings.

Although it finds for particularly advantageous application the production of FinFET type transistors, the invention applies to all etchings of a dielectric layer on a three-dimensional structure. Thus, it will be used to produce transistors based on nanowires, in particular based on stacked nanowires.

The invention claimed is:

1. A method for etching a dielectric layer made of a dielectric material covering a top and a flank of a three-dimensional structure, the method comprising:
   forming, before the depositing of the dielectric layer, an intermediate protective layer based on a protective material different from the dielectric material, the intermediate protective layer being formed directly on the top and the flank of the three-dimensional structure so as to completely cover the three-dimensional structure and such that the intermediate protective layer is located between the top and the dielectric layer;
   depositing the dielectric layer over the intermediate protective layer on the top and the flank of the three-dimensional structure;
   performing a plurality of sequences each comprising at least the following successive steps:
      a first etching of the dielectric layer by a first plasma based on a chemistry comprising at least one first fluorine-based compound and oxygen, the first etching being performed so as to:
         generate an ion bombardment directed mainly along a direction parallel to the flank,
         regulate an amount of the at least one first fluorine-based compound to consume all of the at least one first fluorine-based compound during the first etching so as to interrupt the first etching before consumption of an entire thickness of the dielectric layer located on the flank, and after having consumed an entire thickness of the dielectric layer located at the top, and
         form a first oxide-based protective layer at the top of the three-dimensional structure and form a second oxide-based protective layer on an upper portion of the dielectric layer located on the flank, a thickness of the first protective layer being greater than a thickness of the second protective layer, and
      a second etching directed mainly along the direction parallel to the flank, the second etching being configured to completely remove the second protective layer while retaining a portion of the thickness of the first protective layer above the top of the structure; and
   repeating the sequence of the first and the second etchings until complete removal of the dielectric layer located on the flank of the three-dimensional structure while maintaining the intermediate protective layer on the top and the flank of the three-dimensional structure.

2. The method according to claim 1, wherein the protective material is based on SiXO, X being a species chosen from carbon and nitrogen, such that the intermediate protective layer promotes the formation of the first oxide-based protective layer.

3. The method according to claim 1, wherein the protective material has a resistance to etching by hydrofluoric acid, so that an etch rate of the protective material by a HF-based solution is less than 5 nm/min.

4. The method according to claim 1, wherein the protective material has a dielectric constant less than or equal to 4.

5. The method according to claim 1, wherein the first plasma further comprises at least one second compound chosen from SiwCl (2*w*+2) and SiwF (2*w*+2), with w being a nonzero integer.

6. The method according to claim 1, wherein the second etching is performed by a second plasma based on at least one fluorocarbon species CxHyFz, with x, y, and z being integers.

7. The method according to claim 1, wherein the forming of the intermediate protective layer is performed so that the intermediate protective layer has a thickness between 2 nm and 5 nm.

8. The method according to claim 1, wherein the first etching is performed so that the formed first oxide-based protective layer has a thickness greater than or equal to 5 nm.

9. The method according to claim 1, wherein the second etching is further performed so that the retained portion of the thickness of the first protective layer has a thickness greater than or equal to 2 nm.

10. The method according to claim 1, wherein the three-dimensional structure is made of a semiconductor material and forms a channel of a FinFET transistor.

11. A method for producing a FinFET transistor surmounting a support substrate, the FinFET transistor comprising a gate pattern and at least one channel passing through the gate pattern and extending from one flank of the gate pattern to form at least one structure made of a semiconductor material, the at least one structure having a top and at least two flanks, the method comprising:
   etching the dielectric layer made of the dielectric material covering at least the top and one flank of the structure by implementing the method according to claim 1, so as to completely remove the dielectric layer located on the structure by retaining a portion of dielectric layer on the flank of the gate pattern, so that the portion forms a spacer of the FinFET transistor.

12. The method according to claim 11, wherein the gate pattern comprises a gate and a hard mask surmounting a top of the gate, the hard mask having a thickness e150, such that e150≥e30, with e30 being a height of the structure.

13. The method according to claim 11, wherein the gate pattern comprises a gate and a hard mask surmounting a top of the gate, the hard mask having a thickness e150, such that e150≥1.2*e30, with e30 being a height of the structure.

14. The method of claim 1, wherein the method further comprises, after the complete removal of the dielectric layer located on the flank of the three-dimensional structure, oxidizing the intermediate protective layer.

15. The method of claim 1, wherein after performance of the repeating step, the dielectric layer is completely removed, without removal of any of the intermediate protective layer.

16. The method of claim 1, wherein the intermediate protective layer is based on SiON or SiOCH.

17. The method of claim 1, wherein the intermediate protective layer is resistant to the first and second etchings.

18. A method for etching a dielectric layer made of a dielectric material covering at least one top and one flank of a three-dimensional structure, the method comprising:
depositing the dielectric layer on the top and the flank of the three-dimensional structure;
performing a plurality of sequences each comprising at least the following successive steps:
a first etching of the dielectric layer by a first plasma based on a chemistry comprising at least one first fluorine-based compound and oxygen, the first etching being performed so as to:
generate an ion bombardment directed mainly along a direction parallel to the flank,
regulate an amount of the at least one first fluorine-based compound to consume all of the at least one first fluorine-based compound during the first etching so as to interrupt the first etching before consumption of an entire thickness of the dielectric layer located on the flank, and after having consumed an entire thickness of the dielectric layer located at the top, and
form a first oxide-based protective layer at the top of the three-dimensional structure and form a second oxide-based protective layer on an upper portion of the dielectric layer located on the flank, a thickness of the first protective layer being greater than a thickness of the second protective layer, and
a second etching directed mainly along the direction parallel to the flank, the second etching being configured to completely remove the second protective layer while retaining a portion of the thickness of the first protective layer above the top of the structure;
repeating the sequence of the first and the second etchings until complete removal of the dielectric layer located on the flank of the three-dimensional structure; and
forming, before the depositing of the dielectric layer, an intermediate protective layer based on a protective material different from the dielectric material, the intermediate protective layer being formed so as to completely cover the three-dimensional structure and such that the intermediate protective layer is located between the at least one top and the dielectric layer,
wherein the method further comprises, after the complete removal of the dielectric layer located on the flank of the three-dimensional structure, performing a step of oxidizing the intermediate protective layer followed by a step of removing the oxidized intermediate protective layer.

19. The method according to claim 18, wherein the protective material of the intermediate protective layer is SiCO, and the oxidized step is performed by an oxygen-based plasma such that the oxidized intermediate protective layer is based on SiO2.

20. The method according to claim 19, wherein the step of removing the oxidized intermediate protective layer is performed by a hydrofluoric acid-based etching solution.

* * * * *